(12) United States Patent
Yen et al.

(10) Patent No.: US 9,084,341 B2
(45) Date of Patent: Jul. 14, 2015

(54) FABRICATION METHOD OF PACKAGING SUBSTRATE

(71) Applicant: Advance Materials Corporation, Toayuan (TW)

(72) Inventors: Lee-Sheng Yen, Toayuan (TW); Doau-Tzu Wang, Taoyuan (TW)

(73) Assignee: Advance Materials Corporation, Toayuan (TW)

( * ) Notice: Subject to any disclaimer, the term of this patent is extended or adjusted under 35 U.S.C. 154(b) by 0 days.

(21) Appl. No.: 14/190,428

(22) Filed: Feb. 26, 2014

(65) Prior Publication Data
US 2014/0174644 A1 Jun. 26, 2014

Related U.S. Application Data

(62) Division of application No. 13/323,205, filed on Dec. 12, 2011, now Pat. No. 8,698,008.

(51) Int. Cl.
*H05K 3/00* (2006.01)
*H01L 21/683* (2006.01)
*H01L 23/498* (2006.01)
*H01L 21/48* (2006.01)

(52) U.S. Cl.
CPC ............ *H05K 3/0058* (2013.01); *H01L 21/486* (2013.01); *H01L 21/6835* (2013.01); *H01L 23/49827* (2013.01); *H05K 3/0097* (2013.01); *H01L 2221/68345* (2013.01); *H01L 2924/0002* (2013.01); *H05K 2203/1536* (2013.01); *Y10T 29/49165* (2015.01)

(58) Field of Classification Search
CPC .............. H05K 3/0058; H05K 3/0097; H05K 2203/1536
See application file for complete search history.

(56) References Cited

U.S. PATENT DOCUMENTS

| | | | |
|---|---|---|---|
| 7,353,590 | B2 | 4/2008 | Fallon et al. |
| 2005/0088833 | A1 | 4/2005 | Kikuchi et al. |
| 2006/0270211 | A1 | 11/2006 | Nakamura et al. |

*Primary Examiner* — Jeremy C Norris
(74) *Attorney, Agent, or Firm* — Mintz Levin Cohn Ferris Glovsky and Popeo, P.C.; Peter F. Corless; Steven M. Jensen

(57) ABSTRACT

A packaging substrate is provided, which includes: a core layer having opposite first and second surfaces; two circuit layers formed on the first and second surfaces, respectively; a plurality of conductive through holes penetrating the core layer and electrically connected to the first and second circuit layers; two insulating protection layers disposed on the first and second surfaces of the core layer and the circuit layers; and a carrier attached to one of the insulating protection layers for preventing cracking of the packaging substrate during transportation or packaging.

9 Claims, 5 Drawing Sheets

US 9,084,341 B2

FABRICATION METHOD OF PACKAGING SUBSTRATE

CROSS-REFERENCE TO RELATED APPLICATION

This application is a divisional of copending application U.S. Ser. No. 13/323,205, filed on Dec. 12, 2011.

BACKGROUND OF THE INVENTION

1. Field of the Invention

The present invention relates to packaging substrates and fabrication methods thereof, and more particularly, to a packaging substrate which facilitates thinning of package structures and a fabrication method thereof.

2. Description of Related Art

Along with the rapid development of electronic industries, electronic products are developed towards multi-function and high performance. To minimize semiconductor packages, packaging substrates carrying semiconductor chips are required to have reduced thicknesses. Such a packaging substrate can be made of a hard material or a soft material. Packaging substrates used in ball grid array (BGA) packages are generally made of a hard material.

FIGS. 1A to 1C are schematic cross-sectional views showing a fabrication method of a packaging substrate 1 having double-layer circuits.

Referring to FIG. 1A, a core layer 10 is provided. The core layer 10 has a first surface 10a having a first metal layer 11a disposed thereon, a second surface 10b opposite to the first surface 10a and having a second metal layer 11b disposed thereon, and a plurality of through holes 100 penetrating the first and second surfaces 10a, 10b.

Referring to FIG. 1B, a patterning process is performed to use the first and second metal layers 11a, 11b (using a conductive layer 12 on the first and second metal layers 11a, 11b as a current conductive path for electroplating) to form a first circuit layer 13a and a second circuit layer 13b on the first surface 10a and the second surface 10b of the core layer 10, respectively, and form a plurality of conductive through holes 14 in the through holes 100 for electrically connecting the first and second circuit layers 13a, 13b. Therein, the first and second circuit layers 13a, 13b have a plurality of first and second conductive pads 130a, 130b, respectively.

Referring to FIG. 1C, a first insulating protection layer 15a and a second insulating protection layer 15b are formed on the first surface 10a and the second surface 10b of the core layer 10, respectively. The first and second insulating protection layers 15a, 15b have a plurality of first and second openings 150a, 150b for exposing the first and second conductive pads 130a, 130b, respectively. Further, a first surface finish layer 16a and a second surface finish layer 16b are formed on the exposed first and second conductive pads 150a, 150b, respectively.

Subsequently, a semiconductor chip can be disposed on the second insulating protection layer 15b and encapsulated by an encapsulant so as to form a package structure. According to the current processing technology, the thickness S of the packaging substrate 1 can be reduced to 150 um.

However, such a packaging substrate having a thickness of 150 um is difficult to meet the miniaturization requirement of semiconductor packages. On the other hand, if the thickness of the packaging substrate 1 is reduced to be less than 150 um, the packaging substrate 1 is easy to crack during transportation or packaging, thereby adversely affecting the product yield.

Therefore, there is a need to provide a packaging substrate and a fabrication method thereof so as to overcome the above-described drawbacks.

SUMMARY OF THE INVENTION

Accordingly, the present invention provides a packaging substrate, which comprises: a core layer having a first surface and a second surface opposite to the first surface; a first circuit layer formed on the first surface of the core layer and having a plurality of first conductive pads; a second circuit layer formed on the second surface of the core layer and having a plurality of second conductive pads; a plurality of conductive through holes penetrating the core layer for electrically connecting the first and second circuit layers; a first insulating protection layer disposed on the first surface of the core layer and the first circuit layer and having a plurality of openings for exposing the first conductive pads of the first circuit layer, respectively; a first surface finish layer formed on the exposed first conductive pads; a second insulating protection layer formed on the second surface of the core layer and the second circuit layer and having a plurality of openings for exposing the second conductive pads of the second circuit layer, respectively; a second surface finish layer formed on the exposed second conductive pads; and a carrier attached to the first insulating protection layer through an adhesive layer.

The present invention further provides a fabrication method of a packaging substrate, which comprises the steps of: providing two core layers each having a first surface having a first metal layer formed thereon and a second surface opposite to the first surface and having a second metal layer formed thereon, and a plurality of through holes penetrating through the first metal layer and the first surface of the core layer so as to expose portions of the second metal layer; bonding the second metal layers of the two core layers together through an adhesive member for connecting the two core layers; using the first metal layer of each of the core layers to form a first circuit layer having a plurality of first conductive pads on the first surface of the core layer and form conductive through holes in the through holes of the core layer for electrically connecting the first circuit layer; forming first insulating protection layers on the first surfaces of the core layers and the first circuit layers, each of the first insulating protection layers having a plurality of openings for exposing the first conductive pads so as for a first surface finish layer to be formed on the exposed first conductive pads; attaching a carrier to each of the first insulating protection layers through an adhesive layer; removing the adhesive member so as to obtain two substrate bodies; stacking the carriers of the two substrate bodies on one another by using a bonding member so as to expose the second metal layers; using the second metal layer of each of the core layers to form a second circuit layer having a plurality of second conductive pads and electrically connecting the conductive through holes; forming second insulating protection layers on the second surfaces of the core layers and the second circuit layers, each of the second insulating protection layers having a plurality of openings for exposing the second conductive pads so as for a second surface finish layer to be formed on the exposed second conductive pads, thereby forming two packaging substrates; and removing the bonding member so as to separate the two packaging substrates from each other.

The present invention further provides another fabrication method of a packaging substrate, which comprises the steps of: providing two core layers each having a first surface having a first metal layer formed thereon and a second surface opposite to the first surface and having a second metal layer formed thereon, and a plurality of through holes penetrating through the first metal layer and the first surface of the core layer so as to expose portions of the second metal layer; bonding the second metal layers of the two core layers together through an adhesive member for connecting the two core layers; using the first metal layer of each of the core layers to form a first circuit layer having a plurality of first conductive pads on the first surface of the core layer and form conductive through holes in the through holes of the core layer for electrically connecting the first circuit layer; forming first insulating protection layers on the first surfaces of the core layers and the first circuit layers, each of the first insulating protection layers having a plurality of openings for exposing the first conductive pads so as for a first surface finish layer to be formed on the exposed first conductive pads; attaching a carrier to each of the first insulating protection layers through an adhesive layer; removing the adhesive member so as to obtain two substrate bodies; using the second metal layer of each of the substrate bodies to form a second circuit layer having a plurality of second conductive pads and electrically connecting the conductive through holes; and forming a second insulating protection layer on the second surface of the core layer and the second circuit layer, the second insulating protection layer having a plurality of openings for exposing the second conductive pads so as for a second surface finish layer to be formed on the exposed second conductive pads.

Therein, the adhesive layers can be made of glue or release agent, and the carriers can be made of a high temperature resistant material.

Further, the thickness of the packaging substrate minus the thickness of the carrier thereof is less than 150 um.

Therefore, by attaching a carrier to the first insulating protection layer of the packaging substrate, the packaging substrate is prevented from cracking during transportation or packaging. Furthermore, after the carrier is removed, the packaging substrate has a thickness less than 150 um, which accordingly leads to a package structure having a reduced thickness. Therefore, the packaging substrate of the present invention meets the requirements of both miniaturization and reliability.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "one", "on", "top", "bottom" etc. are merely for illustrative purpose and should not be construed to limit the scope of the present invention.

FIGS. 2A to 2I are schematic cross-sectional views showing a fabrication method of a packaging substrate 2 according to an embodiment of the present invention.

Figure 1A:
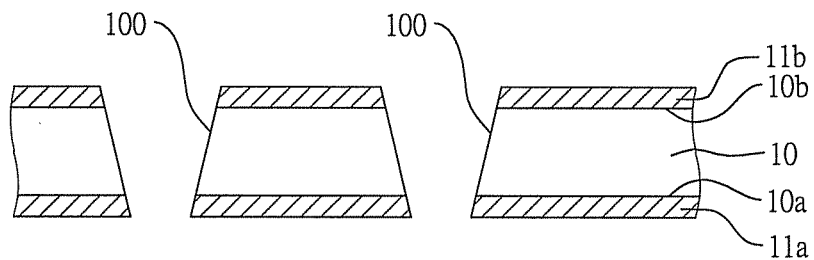
FIGS. 1A to 1C are schematic cross-sectional views showing a conventional fabrication method of a packaging substrate having double-layer circuits.
Figure 1B:
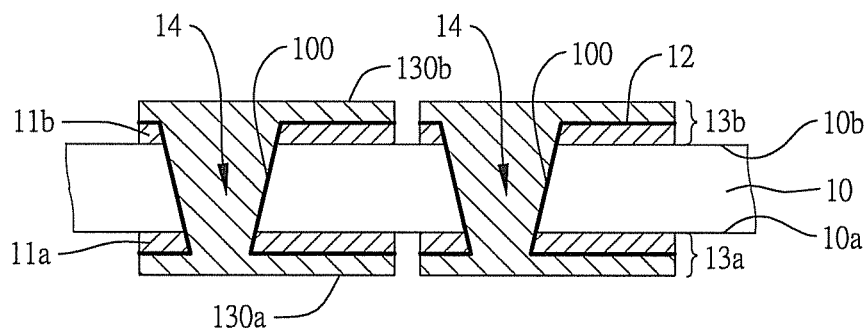
Figure 1C:
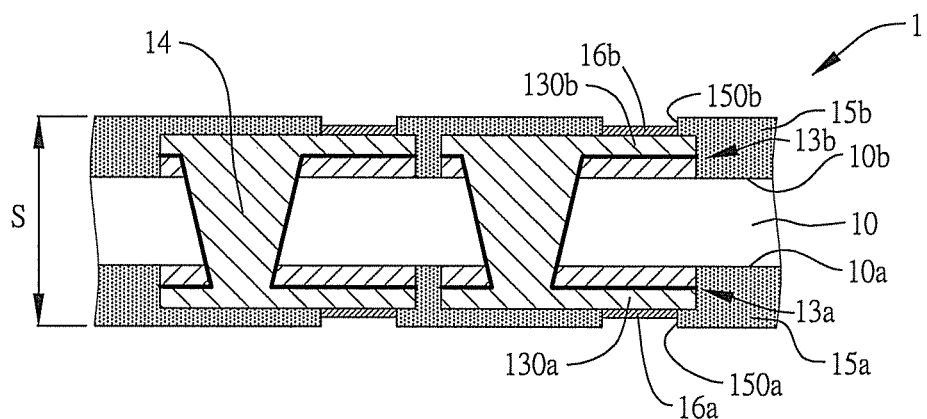
Figure 2A:
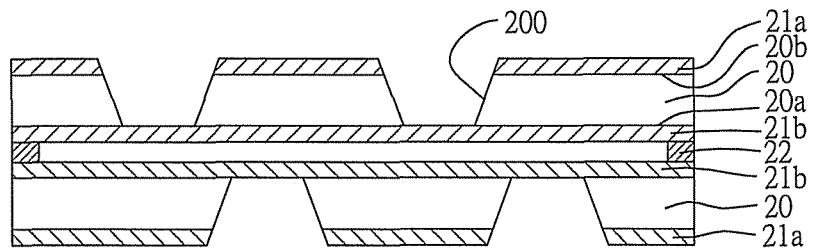
FIGS. 2A to 2I are schematic cross-sectional views showing a fabrication method of a packaging substrate according to an embodiment of the present invention, wherein FIG. 2F' shows another embodiment of FIG. 2F.

Referring to FIG. 2A, two core layers 20 are provided. Each of the core layers 20 has a first surface 20a and a second surface 20b opposite to the first surface 20a. A first metal layer 21a is formed on the first surface 20a and a second metal layer 21b is formed on the second surface 20b. A plurality of through holes 200 are formed to penetrate through the first metal layer 21a and the first surface 20a of the core layer 20 so as to expose portions of the second metal layer 21b.

The second metal layers 21b of the two core layers 20 are bonded together through a plurality of adhesive members 22 so as for the two core layers 20 to be stacked on one another.

The core layers 20 can be made of an organic polymer material such as BT (Bismaleimide-Triazine) or a dielectric material such as prepreg. Each of the core layers 20 has a thickness less than 60 um. The first and second metal layers 21a, 21b can be made of copper, and the adhesive members 22 can be made of glue.

Although each of the core layers 20 has a thickness less than 60 um, the two core layers stacked on one another have an increased thickness such that devices used in fabrication of a conventional packaging substrate can be used herein, thereby reducing the fabrication cost.

Figure 2B:
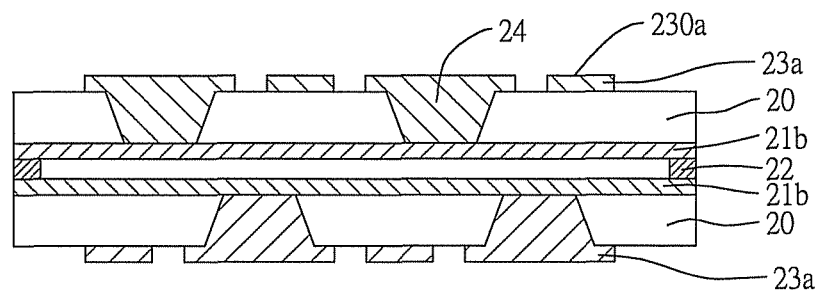

Referring to FIG. 2B, a patterning process is performed to use the first metal layer 21a of each of the core layers 20 to form a first circuit layer 23a on the first surface 20a of the core layer 20 and form conductive through holes 24 in the through holes 200 for electrically connecting the first circuit layer 23a. Further, the first circuit layer 23a has a plurality of first conductive pads 230a.

Various circuit fabrication processes well known in the art can be applied in the present invention without any special limitation and detailed description thereof is omitted herein.

Figure 2C:
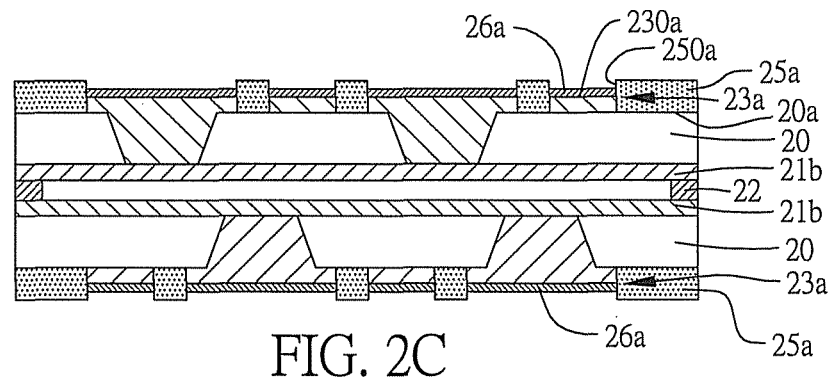

Referring to FIG. 2C, first insulating protection layers 25a are formed on the first surfaces 20a of the core layers 20 and the circuit layers 23a. Each of the insulating protection layers 25a has a plurality of first openings 250a for exposing the first conductive pads 230a. In other embodiments, the first conductive pads 230a can be higher than or flush with the surface of the first insulating protection layer 25a so as to be exposed from the first insulating protection layer 25a.

Then, first surface finish layers 26a are formed on the first conductive pads 230a exposed through the first openings 250a of the first insulating protection layers 25a.

Figure 2D:
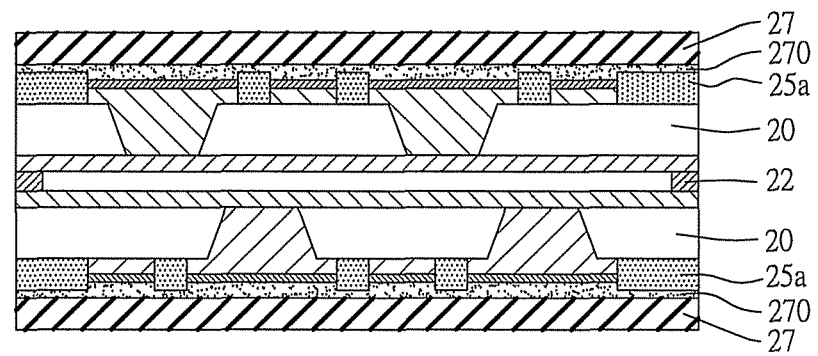

Referring to FIG. 2D, a carrier 27 is attached to each of the first insulating protection layers 25a through an adhesive layer 270. In the present embodiment, the adhesive layer 270 can be made of glue or release agent. The carrier 27 can be made of a high temperature resistant material, such as a copper clad laminate (CCL).

Figure 2E:
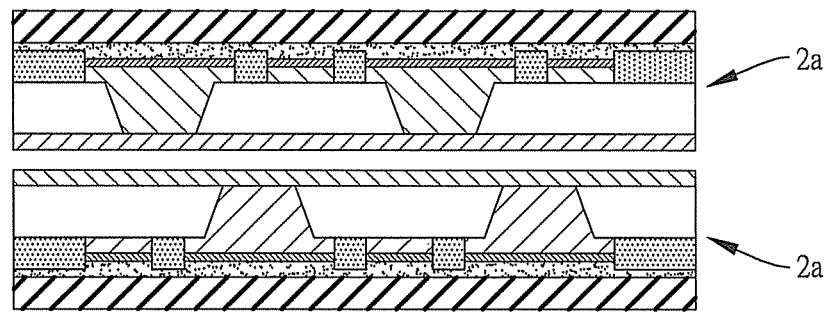

Referring to FIG. 2E, the adhesive members 22 are removed to obtain two substrate bodies 2a separated from each other.

Figure 2F:
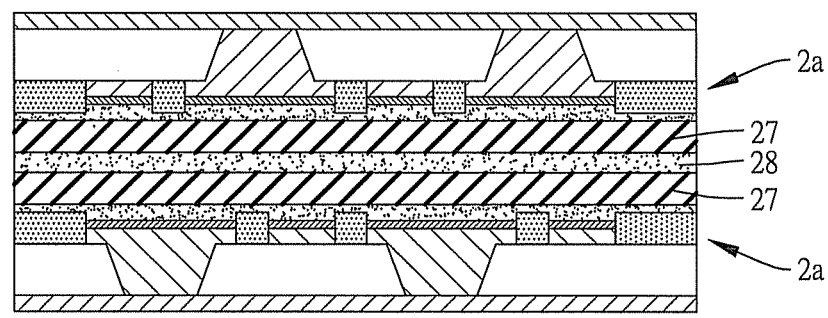
Figure 2F:
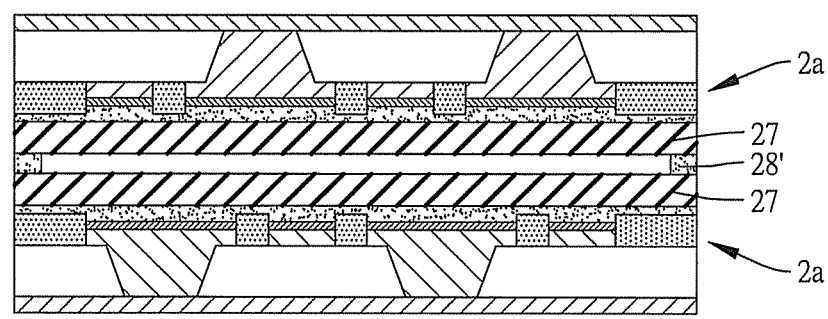

Referring to FIG. 2F or FIG. 2F', the carriers 27 are stacked on one another through a bonding member 28 or 28' so as to expose the second metal layers 21b. In the present embodiment, the bonding member 28, 28' can be an adhesive bump (as shown in FIG. 2F') or an adhesive layer (as shown in FIG. 2F).

Figure 2G:
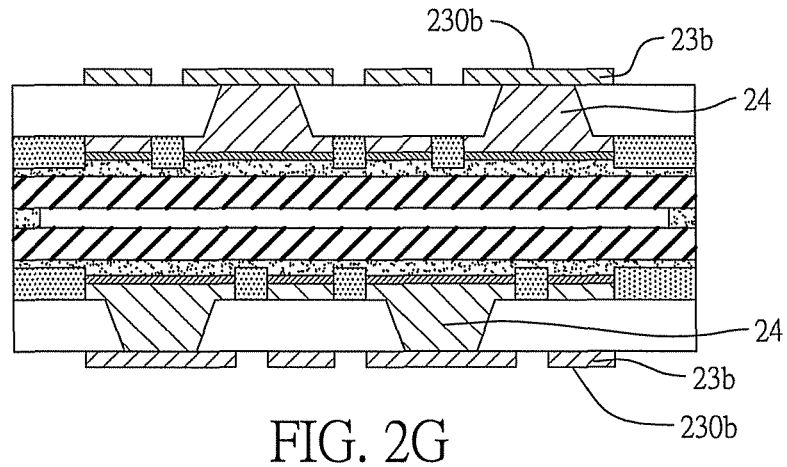

Referring to FIG. 2G, the second metal layer 21b of each of the core layers 20 is used to form a second circuit layer 23b electrically connecting the conductive through holes 24 and having a plurality of second conductive pads 230b.

Figure 2H:
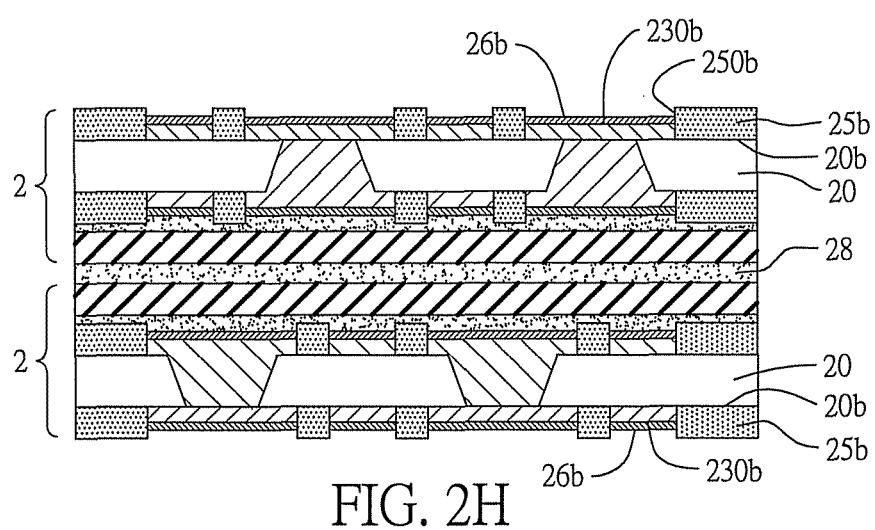

Referring to FIG. 2H, second insulating protection layers 25b are formed on the second surfaces 20b of the core layers 20 and the second circuit layers 23b. Each of the second insulating protection layers 25b has a plurality of second openings 250b for exposing the second conductive pads 230b, respectively. In other embodiments, the second conductive pads 230b can be higher than or flush with the surface of the second insulating protection layer 25b so as to be exposed from the second insulating protection layer 25b.

Furthermore, second surface finish layers 26b are formed on the second conductive pads 230b exposed through the second openings 250b of the second insulating protection layers 25b.

Figure 2I:
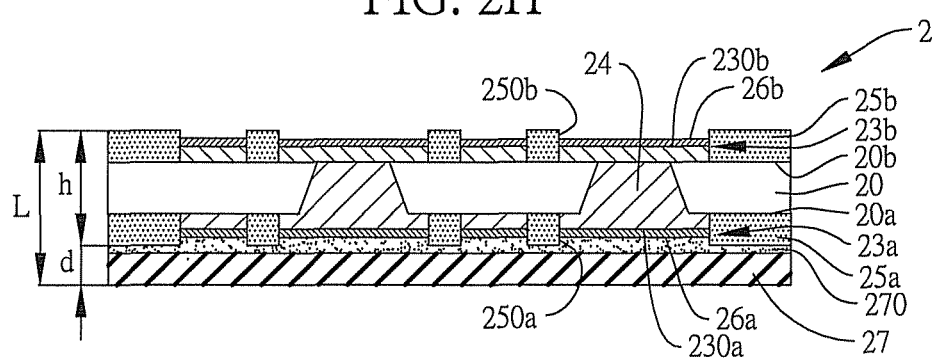

Referring to FIG. 2I, the bonding member 28 is removed so as to obtain two packaging substrates 2 separated from each other. The height L of each of the packaging substrates 2 minus the thickness d of the carrier 27 thereof is equal to h, which is less than 150 um. Therein, the adhesive layer 270 is thin enough to be ignored. The thickness d of the carrier 27 can be changed according to practical needs without any special limitation.

Figure 3A:
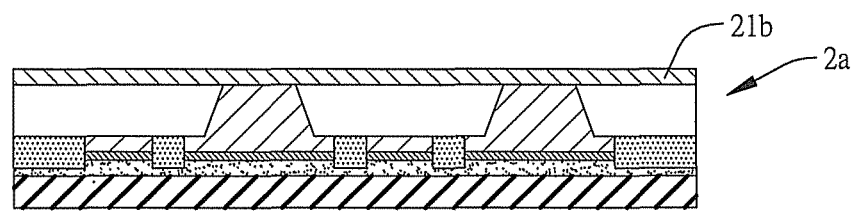
FIGS. 3A to 3C are schematic cross-sectional views showing a fabrication method of a packaging substrate according to another embodiment of the present invention.
Figure 3B:
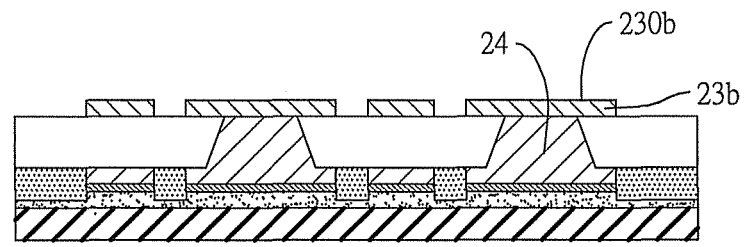
Figure 3C:
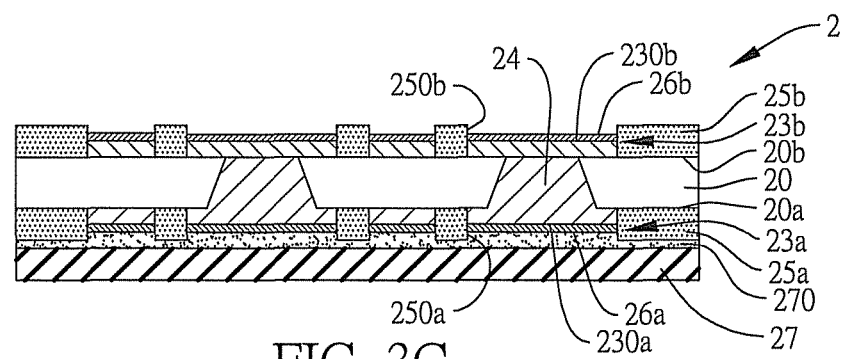

FIGS. 3A to 3C are cross-sectional views showing a fabrication method of a packaging substrate 2 according to another embodiment of the present invention.

Referring to FIG. 3A, which is the same as FIG. 2E, the adhesive members 22 are removed to obtain two substrate bodies 2a.

Referring to FIG. 3B, different from the previous embodiment, the two substrate bodies 2a are not stacked in the present embodiment. For each of the substrate bodies 2a, the second metal layer 21b is used to form a second circuit layer 23b electrically connecting the conductive through holes 24 and having a plurality of second conductive pads 230b.

Referring to FIG. 3C, a second insulating protection layer 25b is formed on the second surface 20b of the core layer 20 and the second circuit layer 23b, and has a plurality of second openings 250b for exposing the second conductive pads 230b of the second circuit layer 23b.

Then, a second surface finish layer 26b is formed on the second conductive pads 230b exposed through the second openings 250b of the second insulating protection layer 25b. As such, a packaging substrate 2 is obtained. The overall thickness L of the packaging substrate 2 minus the thickness d of the carrier 27 thereof is equal to h, which is less than 150 um.

Generally, to fabricate a substrate having a thickness less than 150 um, new devices must be provided, which accordingly increases the fabrication cost. In the present invention, although h is less than 150 um, the overall thickness L of the packaging substrate 2 having the carrier 27 during fabrication is greater than or equal to 150 um. Therefore, the original devices used in fabrication of a conventional packaging substrate can be used in the present invention so as to save the fabrication cost.

In subsequent processes, a semiconductor chip (now shown) can be disposed on the second insulating protection layer 25b and encapsulated and then the carrier 27 can be removed so as to obtain a package structure. Since the thickness h of the packaging substrate 2 without the carrier 27 is less than 150 um, the overall thickness of the package structure is accordingly reduced. Therefore, the packaging substrate 2 of the present invention meets the miniaturization requirement.

During the fabrication process of the packaging substrate 2, the carrier 27 helps to enhance the strength of the packaging substrate 2 to thereby prevent cracking of the packaging substrate 2 during transportation or packaging.

Moreover, the stacked core layers 20 or substrate bodies 2a facilitate mass production of the packaging substrate.

The present invention further provides a packaging substrate 2, which has: a core layer 20 having a first surface 20a and a second surface 20b opposite to the first surface 20a; a first circuit layer 23a disposed on the first surface 20a of the core layer 20 and a second circuit layer 23b disposed on the second surface 20b of the core layer 20; a plurality of conductive through holes 24 disposed in the core layer 20; a first insulating protection layer 25a disposed on the first surface 20a of the core layer 20 and the first circuit layer 23a and a second insulating protection layer 25b disposed on the second surface 20b of the core layer 20 and the second circuit layer 23b; and a carrier 27 attached to the first insulating protection layer 25a.

The first circuit layer 23a has a plurality of first conductive pads 230a, and the second circuit layer 23b has a plurality of second conductive pads 230b. The conductive through holes 24 electrically connect the first and second circuit layers 23a, 23b.

The first insulating protection layer 25a has a plurality of first openings 250a for exposing the first conductive pads 230a, and a first surface finish layer 26a is disposed on the first conductive pads 230a exposed through the first openings 250a of the first insulating protection layer 25a.

The second insulating protection layer 25b has a plurality of second openings 250b for exposing the second conductive pads 230b, and a second surface finish layer 26b is disposed on the second conductive pads 230b exposed through the second openings 250b of the second insulating protection layer 25b.

The carrier 27 is attached to the first conductive pads 230a and the first insulating protection layer 25a through an adhesive layer 270. In the present embodiment, the adhesive layer 270 can be made of glue or release agent. The carrier 27 is made of a high temperature resistant material.

Further, the thickness L of the packaging substrate 2 minus the thickness d of the carrier 27 is less than 150 um.

According to the present invention, a carrier is attached to the first insulating protection layer of the packaging substrate so as to enhance the overall strength of the packaging substrate, thereby effectively avoiding cracking of the packaging substrate during transportation or packaging.

Further, after the carrier is removed, the thickness of the packaging substrate is less than 150 um, which accordingly leads to a package structure having a reduced thickness. Therefore, the packaging substrate of the present invention meets the requirements of both miniaturization and reliability.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a packaging substrate, comprising the steps of:
   providing two core layers each having a first surface having a first metal layer formed thereon and a second surface opposite to the first surface and having a second metal layer formed thereon, and a plurality of through holes penetrating through the first metal layer and the first surface of the core layer so as to expose portions of the second metal layer;

bonding the second metal layers of the two core layers together through an adhesive member for connecting the two core layers;

using the first metal layer of each of the core layers to form a first circuit layer having a plurality of first conductive pads on the first surface of the core layer and form conductive through holes in the through holes of the core layer for electrically connecting the first circuit layer;

forming first insulating protection layers on the first surfaces of the core layers and the first circuit layers, each of the first insulating protection layers having a plurality of openings for exposing the first conductive pads so as for a first surface finish layer to be formed on the exposed first conductive pads;

attaching a carrier to each of the first insulating protection layers through an adhesive layer;

removing the adhesive member so as to obtain two substrate bodies;

stacking the carriers of the two substrate bodies on one another by using a bonding member so as to expose the second metal layers;

using the second metal layer of each of the core layers to form a second circuit layer having a plurality of second conductive pads and electrically connecting the conductive through holes;

forming second insulating protection layers on the second surfaces of the core layers and the second circuit layers, each of the second insulating protection layers having a plurality of openings for exposing the second conductive pads so as for a second surface finish layer to be formed on the exposed second conductive pads, thereby forming two packaging substrates; and removing the bonding member so as to separate the two packaging substrates from each other.

2. The method of claim 1, wherein the bonding member is an adhesive bump or an adhesive layer.

3. The method of claim 1, wherein the adhesive layers are made of glue or release agent.

4. The method of claim 1, wherein the carriers are made of a high temperature resistant material.

5. The method of claim 1, wherein a thickness of the packaging substrate minus that of the carrier thereof is less than 150 um.

6. A fabrication method of a packaging substrate, comprising the steps of:

providing two core layers each having a first surface having a first metal layer formed thereon and a second surface opposite to the first surface and having a second metal layer formed thereon, and a plurality of through holes penetrating through the first metal layer and the first surface of the core layer so as to expose portions of the second metal layer;

bonding the second metal layers of the two core layers together through an adhesive member for connecting the two core layers;

using the first metal layer of each of the core layers to form a first circuit layer having a plurality of first conductive pads on the first surface of the core layer and form conductive through holes in the through holes of the core layer for electrically connecting the first circuit layer;

forming first insulating protection layers on the first surfaces of the core layers and the first circuit layers, each of the first insulating protection layers having a plurality of openings for exposing the first conductive pads so as for a first surface finish layer to be formed on the exposed first conductive pads;

attaching a carrier to each of the first insulating protection layers through an adhesive layer;

removing the adhesive member so as to obtain two substrate bodies;

using the second metal layer of each of the substrate bodies to form a second circuit layer having a plurality of second conductive pads and electrically connecting the conductive through holes; and forming a second insulating protection layer on the second surface of the core layer and the second circuit layer, the second insulating protection layer having a plurality of openings for exposing the second conductive pads so as for a second surface finish layer to be formed on the exposed second conductive pads.

7. The method of claim 6, wherein the adhesive layers are made of glue or release agent.

8. The method of claim 6, wherein the carriers are made of a high temperature resistant material.

9. The method of claim 6, wherein a thickness of the packaging substrate minus that of the carrier thereof is less than 150 um.

* * * * *